(12) United States Patent
Benisch et al.

(10) Patent No.: US 11,789,040 B2
(45) Date of Patent: Oct. 17, 2023

(54) MEASUREMENT SYSTEM AND METHOD OF OPERATING A MEASUREMENT SYSTEM

(71) Applicant: Rohde & Schwarz GmbH & Co. KG, Munich (DE)

(72) Inventors: Christian Benisch, Munich (DE); Werner Perndl, Munich (DE); Markus Gallhauser, Munich (DE); Nino Voss, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 131 days.

(21) Appl. No.: 17/408,962

(22) Filed: Aug. 23, 2021

(65) Prior Publication Data

US 2021/0382089 A1   Dec. 9, 2021

Related U.S. Application Data

(63) Continuation-in-part of application No. 16/276,091, filed on Feb. 14, 2019, now Pat. No. 11,125,587.

(30) Foreign Application Priority Data

Mar. 13, 2018   (EP) ..................................... 18161600

(51) Int. Cl.
   *G01R 13/02*   (2006.01)
(52) U.S. Cl.
   CPC ................................ *G01R 13/0272* (2013.01)
(58) Field of Classification Search
   CPC ...... G01D 7/00; G08C 17/02; G08C 2201/30; G01R 1/06788; G01R 13/0272; H01Q 13/085

USPC ............. 73/866.1, 570–648, 861.05, 861.06, 73/861.95, 861.18, 861.31, 861.42, 73/861.64, 290 B, 290 V, 866.5
See application file for complete search history.

(56) References Cited

U.S. PATENT DOCUMENTS

| | | |
|---|---|---|
| 2004/0160410 A1 | 8/2004 | Plathe |
| 2004/0222884 A1 | 11/2004 | Costa et al. |
| 2004/0239308 A1 | 12/2004 | Fazzina |
| 2004/0239309 A1 | 12/2004 | Barr et al. |

(Continued)

FOREIGN PATENT DOCUMENTS

| | | |
|---|---|---|
| CN | 203705546 U | 7/2014 |
| EP | 3232205 A1 | 10/2017 |

*Primary Examiner* — Robert R Raevis
(74) *Attorney, Agent, or Firm* — CHRISTENSEN O'CONNOR JOHNSON KINDNESS PLLC

(57) ABSTRACT

A measurement system including a measurement device and at least a first probe unit and a second probe unit is disclosed. The first probe unit and the second probe unit are each connected to the measurement device in a signal transmitting manner. The measurement device includes a control circuit. The first probe unit includes an interface module being configured to receive a user input, to generate an input data signal based on the received user input, and to provide the input data signal to the control circuit. The control circuit is configured to generate and provide a control signal at least to the second probe unit based on the input data signal. At least the second probe unit is configured to adjust an operational parameter based on the control signal, wherein the operational parameter relates to a measurement parameter to be measured Moreover, a method for operating a measurement system is disclosed.

21 Claims, 2 Drawing Sheets

(56) References Cited

U.S. PATENT DOCUMENTS

2005/0194978 A1    9/2005    Smith
2005/0200346 A1    9/2005    Novak et al.
2013/0106401 A1    5/2013    Johnson et al.

MEASUREMENT SYSTEM AND METHOD OF OPERATING A MEASUREMENT SYSTEM

CROSS-REFERENCES TO RELATED APPLICATIONS

This application is a continuation-in-part of U.S. application Ser. No. 16/276,091, filed on Feb. 14, 2019, which takes priority from European Application No. 18161600.4, filed Mar. 13, 2018, the disclosures of which are incorporated herein in their entirety.

FIELD OF THE DISCLOSURE

The present disclosure concerns a measurement system as well as a method of operating a measurement system.

BACKGROUND

For certain measurements, several measurement probes may be connected to a main measurement device, wherein the probes may be located at a certain distance from the main measurement device.

In prior art measurement systems, operational parameters of the measurement system are adjusted via a graphical user interface at the main measurement device. Therefore, the operator or rather the user of the measurement system always has to operate the main measurement device for adjusting the operational parameters. Thus, it is not possible for the user to adjust the operational parameters of the measurement system when he is not near to the main measurement device. This can cause various difficulties when configuring the probes, in particular a functional interaction between the probes. Particularly, the installation and setup of the measurement system may be time-consuming.

Therefore, the object is to provide a measurement system as well as a method of operating a measurement system, which improve the disadvantages of the state of the art.

SUMMARY

According to the present disclosure, the problem is solved by a measurement system comprising a measurement device and at least a first probe unit and a second probe unit. The first probe unit and the second probe unit each are connected to the measurement device in a signal transmitting manner. The measurement device comprises a control circuit. The first probe unit comprises an interface, such as an interface module. The interface module is configured to receive a user input and to generate an input data signal based on the received user input. The interface module further is configured to provide the input data signal to the control circuit. The control circuit is configured to generate and provide a control signal at least to the second probe unit based on the input data signal. At least the second probe unit is configured to adjust an operational parameter based on the control signal, wherein the operational parameter relates to a measurement parameter to be measured Accordingly, a user input received via the first probe unit is processed by the control circuit of the measurement device to provide a control signal to at least the second probe unit. Therefore, a user may control the second probe unit (which is possibly located a certain distance away from the first probe) without having to walk to the second probe or to the measurements device. This way, configuring the probe units, for example a functional interaction between the probe units, is greatly simplified for the user. Of course, the first probe unit may also be controlled via the interface module, such that a user can control the first probe unit and the second probe unit while standing at the first probe unit.

Moreover, the second probe unit may also comprise an interface, such as an interface module, being configured similar to the interface module of the first probe unit, such that a user may control all probe units while standing at either one of them.

Generally, the probe units are formed separately from each other. Hence, the measurement system comprises at least two separately formed probe units.

In addition, the measurement device may be established separately with respect to the probe units so that the measurement system comprises at least two separately formed probe units as well as one separately formed measurement device.

The first probe unit may be configured to perform analog or digital signal processing. The measurement device may be an oscilloscope, a logic analyzer and/or any other measurement device suitable for a particular measurement at hand. Moreover, the probe units may be connected to the measurement device either tethered or wirelessly or both.

According to an aspect, the operational parameter is associated with at least one of a power status of the second probe unit, a voltage measurement mode of the second probe unit, or a current measurement mode of the second probe unit. Thus, the second probe unit may be switched on or off by the control signal in response to the user input received by the interface module of the first probe unit. Alternatively or additionally, the second probe unit may be set to a voltage measurement mode and/or to a current measurement mode of the control signal in response to the user input received by the interface module of the first probe unit.

Alternatively or additionally, the operational parameters may comprise one or more selected from the group of: an operational status (e.g. "on" or "off"), a measurement activity status, a frequency to be measured and a bandwidth of a frequency band to be measured. If the control signal is also provided to the first probe unit and/or the measurement device, the first probe unit and/or the measurement device may also be configured to adjust an operational parameter. Accordingly, the operational parameter may relate to a measurement parameter, namely a parameter to be measured.

In an embodiment, the operational parameter is associated with at least one of a magnitude of a voltage to be measured or a magnitude of a current to be measured. Thus, an operational range of the second probe unit may be adapted by the control signal, such that different signals having different magnitudes of voltage and/or current can be measured. For example, the second probe unit may be adapted from measuring voltages in the order of millivolts to measuring voltages in the order of volts.

According to one aspect, the control circuit is configured to provide the control signal to the second probe unit and the measurement device. This way, the user may control both the second probe unit and the measurement device while standing at the first probe unit without leaving the first probe unit.

In some embodiments, the measurement device is configured to adjust an operational parameter of the measurement device based on the control signal. Therefore, a user may control the measurement device (which is possible located a certain distance away from the first probe unit)

without having to walk to the measurement device. This way, configuring the measurement device is greatly simplified for the user.

The operational parameter of the measurement device may be associated with at least one of a power status of the measurement device, a voltage resolution of the measurement device, a voltage range of the measurement device, a current resolution of the measurement device, or a current range of the measurement device. Accordingly, internal settings of the measurement device can be adapted by the user by operating the first probe unit, i.e., without having to operate the measurement device itself.

The measurement device may be configured to store the input data signal and/or visualize the input data signal via a graphical user interface.

In a further aspect, at least one of the first and the second probe units comprises a detector unit being configured to at least one of detect and transmit electromagnetic signals. In particular, the detector unit is configured to detect and/or transmit electromagnetic signals such as radio frequency (RF) signals. For example, the detector unit may comprise an antenna, in particular a tapered slot (Vivaldi) antenna.

In another embodiment of the present disclosure, the detector unit comprises a first and a second interface, the first interface being configured to receive electromagnetic waves and to provide a measurement signal to the second interface. The first interface may be an interface for receiving radio frequency signals.

According to a further aspect, the second interface is configured to generate a processed measurement signal based on the measurement signal. In other words, the second interface converts the measurement signal provided by the first interface to a signal suitable for the measurement device. Accordingly, the second interface may be configured to generate an analog processed measurement signal and/or a digital processed measurement signal, depending on the kind of signal the measurement device is configured to process.

In another aspect, a frequency of the processed measurement signal is lower than a frequency of the received electromagnetic waves. Put another way, the processed measurement signal is down-converted from the measurement signal provided by the first interface.

The control signal may also be forwarded to the first probe unit. Thus, both probe units may be controlled by the user while standing at the first probe unit.

In a certain embodiment of the present disclosure, the control signal comprises at least one control command selected from the group of: switch on at least one of the first probe unit, the second probe unit and the measurement device; switch off at least one of the first probe unit, the second probe unit and the measurement device; transmit data to at least one of the first probe unit, the second probe unit and the measurement device; and adjust a trigger condition.

According to one aspect, the first probe unit comprises a monitoring unit comprised of one or more circuits. The monitoring unit is connected to the measurement device in a signal transmitting manner Via the monitoring unit, operational parameters of the measurement system may be indicated to the user. The monitoring unit may indicate the operational parameters graphically, e.g., via a display, or by means of one or more status lights. Alternatively or additionally, the operational parameters may also be indicated acoustically, e.g., with predefined acoustic patterns According to another aspect, the monitoring unit is configured to indicate a status of at least one of the probe units.

Thus, the user is informed about the status (e.g., "on" or "off") of the probe units without walking to the measurement device or other probe units.

In another embodiment of the present disclosure, the monitoring unit is configured to indicate a representation of the control signal. For example, the monitoring unit displays a representation of possible control commands, in particular in the form of a list or a drop-down menu. This way, configuring the probe units and/or the measurement device is facilitated.

According to one embodiment, the measurement system, in particular the control circuit, is configured to provide the control signal to the second probe unit and the measurement device.

According to another embodiment, the measurement system, in particular the control circuit, is configured to provide the control signal only to the second probe unit.

According to the present disclosure, the problem is also solved by a method of operating a measurement system, in particular a measurement system as described above, wherein the measurement system comprises a measurement device and at least a first probe unit and a second probe unit. The measurement device comprises a control circuit. The first probe unit comprises an interface, such as an interface module. In an embodiment, the method comprises the following steps:

receiving a user input via interface module of the first probe unit;

generating an input data signal based on the user input by the interface module of the first probe unit;

forwarding the input data signal to the control circuit;

generating a control signal based on the input data signal by the control circuit; and adjusting at least one operational parameter of the second probe unit based on the control signal, wherein the operational parameter relates to a measurement parameter to be measured.

Of course, also operational parameters of the first probe unit and/or the measurement device may be adjusted. With regards to the advantages, reference is made to the explanations given above.

As mentioned above, the control signal is generated by the control circuit, which is integrated in the measurement device so that the control signal is generated by the measurement device.

Moreover, the second probe unit or rather the second probe unit and the measurement device may be set appropriately by the control signal.

According to an aspect, the operational parameter is associated with at least one of a power status of the second probe unit, a voltage measurement mode of the second probe unit, or a current measurement mode of the second probe unit. Thus, the second probe unit may be switched on or off by the control signal in response to the user input received by the interface module of the first probe unit. Alternatively or additionally, the second probe unit may be set to a voltage measurement mode and/or to a current measurement mode by the control signal in response to the user input received by the interface module of the first probe unit.

Alternatively or additionally, the operational parameters may comprise one or more selected from the group of: an operational status (e.g. "on" or "off"), a measurement activity status, a frequency to be measured and a bandwidth of a frequency band to be measured. If the control signal is also provided to the first probe unit and/or the measurement device, the first probe unit and/or the measurement device may also be configured to adjust an operational parameter.

Accordingly, the operational parameter may relate to a measurement parameter, namely a parameter to be measured.

In an embodiment, the operational parameter is associated with at least one of a magnitude of a voltage to be measured or a magnitude of a current to be measured. Thus, an operational range of the second probe unit may be adapted by the control signal, such that different signals having different magnitudes of voltage and/or current can be measured. For example, the second probe unit may be adapted from measuring voltages in the order of millivolts to measuring voltages in the order of volts.

In an embodiment, an operational parameter of the measurement device is adjusted based on the control signal. Therefore, a user may control the measurement device (which is possibly located a certain distance away from the first probe unit) without having to walk to the measurement device. This way, configuring the measurement device is greatly simplified for the user.

In a further embodiment, the operational parameter of the measurement device is associated with at least one of a power status of the measurement device, a voltage resolution of the measurement device, a voltage range of the measurement device, a current resolution of the measurement device, or a current range of the measurement device. Accordingly, internal settings of the measurement device can be adapted by the user by operating the first probe unit, i.e., without having to operate the measurement device itself.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
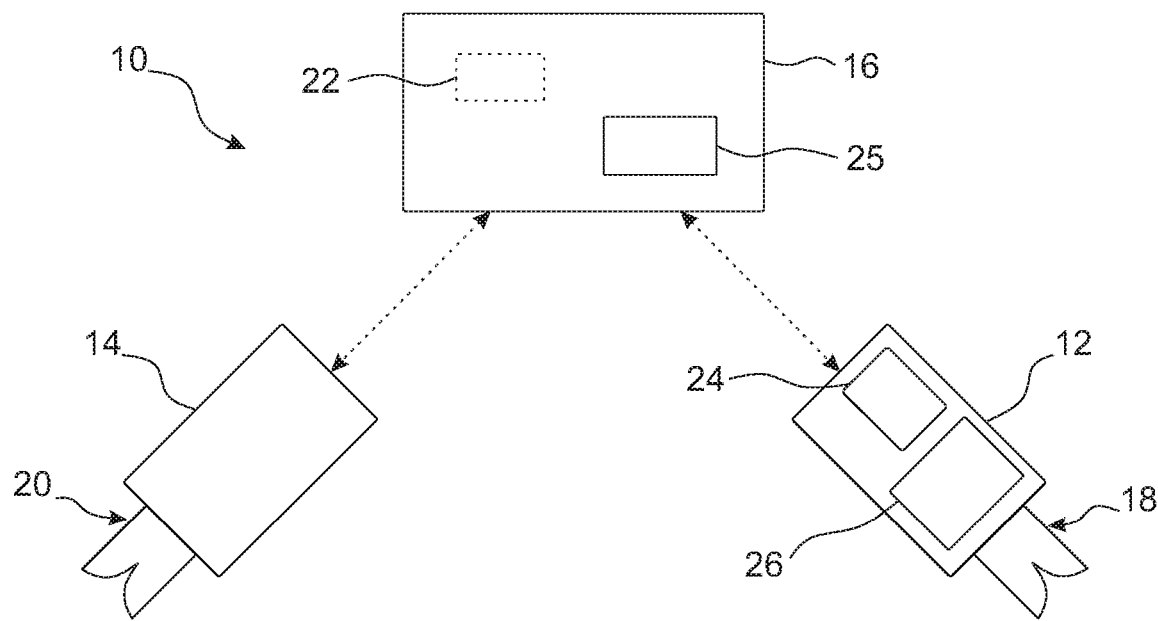
FIG. 1 shows a measurement system according to a first embodiment of a measurement system according to the present disclosure.

FIG. 1 shows a measurement system 10 comprising a first probe unit 12, a second probe unit 14 and a measurement device 16 which are separately formed from each other. The measurement system 10 may also comprise additional probe units.

The measurement device 16 may be an oscilloscope, a logic analyzer and/or any other measurement device suitable for a particular measurement at hand.

The first probe unit 12 and the second probe unit 14 are connected to the measurement device 16 in a signal transmitting manner (indicated by the dashed arrows in FIGS. 1 and 2), which may be tethered or wireless.

The first probe unit 12 and the second probe unit 14 unit can each be configured to perform any kind of measurements. In the example shown in FIGS. 1 and 2, the first probe unit 12 and the second probe unit 14 comprise detector units 18, 20 that are each configured to detect and/or transmit electromagnetic signals, for example radio frequency signals. In some embodiments, the detector units 18, 20 are configured as tapered slot (Vivaldi) antennas.

At least one of the detector units 18, 20 may comprise a first interface and a second interface, wherein the first interface is configured to receive electromagnetic waves and to provide a measurement signal to the second interface.

The second interface is configured to process the measurement signal provided by the first interface. The second interface provides a processed measurement signal based on the measurement signal forwarded by the first interface, wherein the processed measurement signal may be an analog or a digital signal.

In other words, the second interface converts the measurement signal provided by the first interface to a signal suitable for the measurement device 16. Accordingly, the second interface may be configured to generate an analog processed measurement signal and/or a digital processed measurement signal, depending on the kind of signal the measurement device 16 is configured to process.

The processed measurement signal may be down-converted from the measurement signal, i.e. a frequency of the processed measurement signal may be lower than a frequency of the received electromagnetic waves.

The processed measurement signal can then be forwarded to the measurement device 16, in particular by the second interface.

Figure 2:
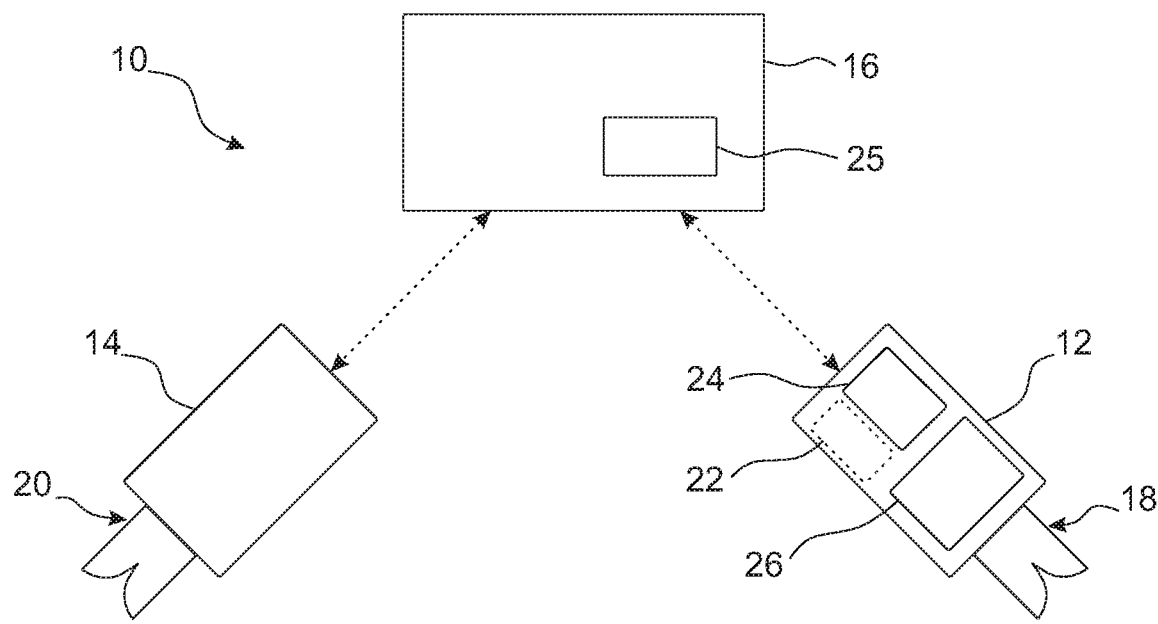
FIG. 2 shows a measurement system according to another embodiment of a measurement system according to the present disclosure.

In the embodiment shown in FIG. 1, the measurement device 16 comprises a control circuit 22, while in the embodiment shown in FIG. 2 the first probe unit 12 comprises the control circuit 22.

An interface module 24 is provided at the first probe unit 12. Via the interface module 24, a user may input data and/or commands. The interface module 24 is configured to generate an input data signal based on the data and/or commands input by the user.

Of course, a second interface module may be provided at the second probe unit 14, which may be configured in a similar manner as the interface module 24.

Figure 3:
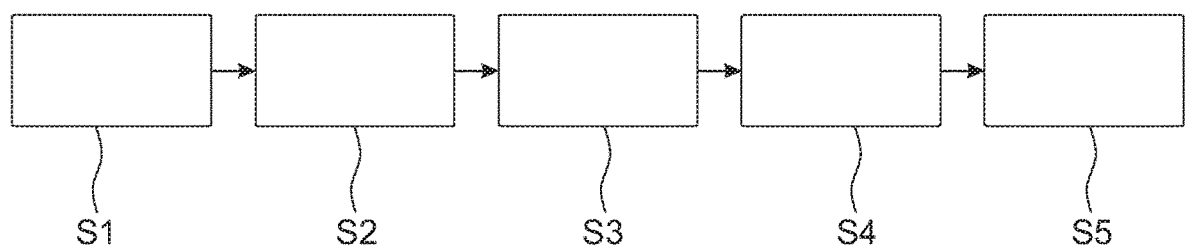
FIG. 3 shows a schematic flow chart of a representative method for operating a measurement system according to an embodiment of the present disclosure.

A representative method of operating the measurement system 10 is described below with reference to FIG. 3. Generally, the method may be applied to both embodiments shown in FIG. 1 and FIG. 2.

First, a user input is received via the first probe unit 12 (step S1), for example via the interface module 24.

Based on the user input, the input data signal is generated via the interface module 24 (step S2) and forwarded to the control circuit 22.

In the embodiment shown in FIG. 1, the input data signal is forwarded to the measurement device 16 by the interface module 24. The measurement device 16 may store the input data signal and/or visualize the input data signal via a graphical user interface 25.

In the embodiment shown in FIG. 2, the input data signal is processed internally since the control circuit 22 is integrated in the first probe unit 12. Irrespective of the integration of the control circuit 22, the control circuit 22 generates a control signal based on the input data signal (step S3). The control signal may comprise at least one control command selected from the group of: switch on at least one of the first probe unit 12, the second probe unit 14 and the measurement device 16; switch off at least one of the first probe unit 12, the second probe unit 14 and the measurement device 16; transmit data to at least one of the first probe unit 12, the second probe unit 14 and the measurement device 16; and adjust a trigger condition.

The control signal is then forwarded at least to the second probe unit 14 (step S4). Additionally, the control signal may also be forwarded to the measurement device 16 and the first probe unit 12 as shown in the embodiment of FIG. 2 since the control circuit 22 is integrated in the first probe unit 12.

In some embodiments, when the control circuit 22 is comprised in the first probe unit 12, the measurement device 16 may just forward the control signal to the second probe unit 14. Hence, the first probe unit 12 only controls the second probe unit 14.

As indicated above, the control signal may also control the second probe unit 14 and the measurement device 16.

Based on the control signal, at least one operational parameter of the second probe unit 14 and/or the first probe unit 12 and/or the measurement device 16 is adjusted (step S5).

To summarize, at least one operational parameter of the measurement system 10, more specifically an operational parameter of the second probe unit 14, the first probe unit 12 and/or the measurement device 16, is adjusted based on an input issued by a user at the first probe unit 12 (or at any other probe unit).

The operational parameters may comprise one or more selected from the group of: an operational status (e.g. "on" or "off"), a measurement activity status, and a measurement parameter such as a frequency to be measured and a bandwidth of a frequency band to be measured.

Alternatively or additionally, the operational parameter may be associated with a voltage measurement mode of the second probe unit 14 or a current measurement mode of the second probe unit.

Thus, the second probe unit 14 may be switched on or off by the control signal in response to the user input received by the interface module 24 of the first probe unit 12.

Alternatively or additionally, the second probe unit 14 may be set to a voltage measurement mode and/or to a current measurement mode by the control signal in response to the user input received by the interface module 24 of the first probe unit 12.

Alternatively or additionally, the operational parameter may be associated with at least one of a magnitude of a voltage to be measured or a magnitude of a current to be measured. Thus, an operational range of the second probe unit 14 may be adapted by the control signal, such that different signals having different magnitudes of voltage and/or current can be measured. For example, the second probe unit may be adapted from measuring voltages in the order of millivolts to measuring voltages in the order of volts.

Of course, the operational parameters of the first probe unit 12 may be adapted analogously to the operational parameters of the second probe unit 14.

Alternatively or additionally, the operational parameters may be associated with at least one of a power status of the measurement device 16, a voltage resolution of the measurement device 16, a voltage range of the measurement device 16, a current resolution of the measurement device 16, or a current range of the measurement device 16. Accordingly, internal settings of the measurement device 16 can be adapted by the user by operating the first probe unit 12 or more precisely the interface module 24 of the first probe unit 12.

The first probe unit 12 may comprise a monitoring unit 26 comprising one or more circuits. The monitoring unit 26 is connected to the measurement device 16 and/or the second probe unit 14 in a signal transmitting manner (i.e., tethered or wireless).

The monitoring unit 26 may indicate a status and/or other operational parameters of at least one of the probe units 12, 14. The monitoring unit 26 may also indicate the status and/or other operational parameters of the measurement device 16.

In some embodiments, the monitoring unit 26 indicates the status and/or other operational parameters graphically, e.g., via a display, or by one or more status lights. Alternatively or additionally, the status and/or operational parameters may also be indicated acoustically, e.g., with predefined acoustic patterns.

Moreover, the monitoring unit 26 may be configured to indicate a representation of the control signal, for example graphically, by one or more status lights and/or acoustically as described above.

It should be understood that the control circuit 22 may include, in some embodiments, logic for implementing the technologies and methodologies described herein. This logic of the control circuit 22 can be carried out in either hardware or software, or a combination of hardware and software. In an example, the functionality of the control circuit 22 could be implemented by special purpose hardware-based computer systems or circuits, etc., or combinations of special purpose hardware and computer instructions. In some embodiments, the control circuit 22 includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof.

In an embodiment, the control circuit 22 includes a microprocessor and a memory storing logic modules and/or instructions. In an embodiment, the control circuit 22 includes one or more ASICs having a plurality of predefined logic components. In an embodiment, the control circuit 22 includes one or more FPGA having a plurality of programmable logic components. In an embodiment, the control circuit 22 includes combinations of circuits and computer program products having software or firmware instructions stored on one or more computer readable memories that work together to cause a device to perform one or more methodologies or technologies described herein. In an embodiment, the control circuit 22 includes hardware circuits (e.g., implementations in analog circuitry, implementations in digital circuitry, and the like, and combinations thereof) for carrying out the functionality described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system comprising a measurement device and at least a first probe unit and a second probe unit,
   the first probe unit and the second probe unit each being connected to the measurement device in a signal transmitting manner;
   the measurement device comprising a control circuit;
   the first probe unit comprising an interface module, the interface module being configured to receive a user input, the interface module further being configured to generate an input data signal based on the received user input, the interface module further being configured to provide the input data signal to the control circuit;
   the control circuit being configured to generate and to provide a control signal at least to the second probe unit based on the input data signal, such that a user is enabled to control the second probe unit by providing the user input to the interface module of the first probe unit; and
   at least the second probe unit being configured to adjust an operational parameter based on the control signal, wherein the operational parameter relates to a measurement parameter to be measured.

2. The measurement system according to claim 1, wherein the operational parameter is associated with at least one of a power status of the second probe, a voltage measurement mode of the second probe, or a current measurement mode of the second probe.

3. The measurement system according to claim 1, wherein the operational parameter is associated with at least one of a magnitude of a voltage to be measured or a magnitude of a current to be measured.

4. The measurement system according to claim 1, wherein the control circuit is configured to provide the control signal to the second probe unit and the measurement device.

5. The measurement system according to claim 4, wherein the measurement device is configured to adjust an operational parameter of the measurement device based on the control signal.

6. The measurement system according to claim 5, wherein the operational parameter of the measurement device is associated with at least one of a power status of the measurement device, a voltage resolution of the measurement device, a voltage range of the measurement device, a current resolution of the measurement device, or a current range of the measurement device.

7. The measurement system according to claim 1, wherein at least one of the first and the second probe units comprises a detector unit being configured to at least one of detect and transmit electromagnetic signals.

8. The measurement system according to claim 7, wherein the detector unit of the at least one of the first and the second probe units comprises a first and a second interface, the first interface being configured to receive electromagnetic waves and to provide a measurement signal to the second interface.

9. The measurement system according to claim 8, wherein the second interface is configured to generate a processed measurement signal based on the measurement signal.

10. The measurement system according to claim 9, wherein a frequency of the processed measurement signal is lower than a frequency of the received electromagnetic waves.

11. The measurement system according to claim 1, wherein the control signal is also forwarded to the first probe unit.

12. The measurement system according to claim 1, wherein the control signal comprises at least one control command selected from the group of: switch on at least one of the first probe unit, the second probe unit and the measurement device; switch off at least one of the first probe unit, the second probe unit and the measurement device; transmit data to at least one of the first probe unit, the second probe unit and the measurement device; and adjust a trigger condition.

13. The measurement system according to claim 1, wherein the first probe unit comprises a monitoring unit being connected to the measurement device in a signal transmitting manner.

14. The measurement system according to claim 13, the monitoring unit being configured to indicate a status of at least one of the probe units.

15. The measurement system according to claim 13, the monitoring unit being configured to indicate a representation of the control signal.

16. A method of operating a measurement system, the measurement system comprising a measurement device and at least a first probe unit and a second probe unit, wherein the measurement device comprises a control circuit, and wherein the first probe unit comprises an interface module, the method comprising:
   receiving a user input via the interface module of the first probe unit;
   generating an input data signal based on the user input by the interface module of the first probe unit;
   forwarding the input data signal to the control circuit;
   generating a control signal based on the input data signal by the control circuit; and
   providing the control signal at least to the second probe unit based on the input data signal, such that a user is enabled to control the second probe unit by providing the user input to the interface module of the first probe unit; and
   adjusting at least one operational parameter of the second probe unit based on the control signal, wherein the operational parameter relates to a measurement parameter to be measured.

17. The method of claim 16, wherein the operational parameter is associated with at least one of a power status of the second probe, a voltage measurement mode of the second probe, or a current measurement mode of the second probe.

18. The method of claim 16, wherein the operational parameter is associated with at least one of a magnitude of a voltage to be measured or a magnitude of a current to be measured.

19. The method of claim 16, wherein an operational parameter of the measurement device is adjusted based on the control signal.

20. The method of claim 19, wherein the operational parameter of the measurement device is associated with at least one of a power status of the measurement device, a voltage resolution of the measurement device, a voltage range of the measurement device, a current resolution of the measurement device, or a current range of the measurement device.

21. A measurement system comprising a measurement device and at least a first probe unit and a second probe unit,
the first probe unit and the second probe unit each being connected to the measurement device in a signal transmitting manner;
the measurement device comprising a control circuit;
the first probe unit comprising an interface module, the interface module being configured to receive a user input, the interface module further being configured to generate an input data signal based on the received user input, the interface module further being configured to provide the input data signal to the control circuit;
the control circuit being configured to generate and to provide a control signal at least to the second probe unit based on the input data signal; and
at least the second probe unit being configured to adjust an operational parameter based on the control signal, wherein the operational parameter relates to a measurement parameter to be measured,
wherein at least one of the first and the second probe units comprises a detector unit being configured to at least one of detect and transmit electromagnetic signals.

* * * * *